US009997237B2

United States Patent
Tandingan et al.

(10) Patent No.: US 9,997,237 B2
(45) Date of Patent: *Jun. 12, 2018

(54) 10-TRANSISTOR NON-VOLATILE STATIC RANDOM-ACCESS MEMORY USING A SINGLE NON-VOLATILE MEMORY ELEMENT AND METHOD OF OPERATION THEREOF

(71) Applicant: Cypress Semiconductor Corporation, San Jose, CA (US)

(72) Inventors: Joseph S Tandingan, Colorado Springs, CO (US); David W. Still, Colorado Springs, CO (US); Jesse J Siman, San Jose, CA (US); Jayant Ashokkumar, Colorado Springs, CO (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days. days.

This patent is subject to a terminal disclaimer.

(21) Appl. No.: 15/487,071

(22) Filed: Apr. 13, 2017

(65) Prior Publication Data
US 2017/0263309 A1 Sep. 14, 2017

Related U.S. Application Data

(63) Continuation of application No. 14/886,663, filed on Oct. 19, 2015, now Pat. No. 9,646,694.
(Continued)

(51) Int. Cl.
*G11C 11/419* (2006.01)
(52) U.S. Cl.
CPC ................. *G11C 11/419* (2013.01)

(58) Field of Classification Search
CPC .............. G11C 11/419; G11C 14/0063; G11C 16/0466
See application file for complete search history.

(56) References Cited

U.S. PATENT DOCUMENTS

| 5,496,756 A | 3/1996 | Sharma et al. |
| 6,097,629 A | 8/2000 | Dietrich et al. |

(Continued)

OTHER PUBLICATIONS

Huang et al., "Low Active Leakage and High Reliability PCM Based Non-Volatile FPGA Storage Element," IEEE Transactions on Circuits and Systems, Jan. 2014 (https:llwww.ece.nus.edu.sg/stfpage/eleak/pdf/tcasl-14.pdf).
(Continued)

*Primary Examiner* — Richard Elms
*Assistant Examiner* — Jerome Leboeuf

(57) ABSTRACT

A memory including an array of nvRAM cells and method of operating the same, where each nvRAM cell includes a volatile charge storage circuit, and a nonvolatile charge storage circuit including a solitary non-volatile memory (NVM) device, a first transistor coupled to the NVM device through which data is coupled to the volatile charge storage circuit, a second transistor coupled to the NVM device through which a compliment of the data is coupled to the volatile charge storage circuit and a third transistor through which the NVM device is coupled to a positive voltage supply line (VCCT). In one embodiment, the first transistor is coupled to a first node of the NVM device, the second transistor is coupled to a second node of the NVM device and the third transistor is coupled between the first node and VCCT. Other embodiments are also disclosed.

19 Claims, 8 Drawing Sheets

Related U.S. Application Data

(60) Provisional application No. 62/066,770, filed on Oct. 21, 2014.

(56) References Cited

U.S. PATENT DOCUMENTS

| | | | |
|---|---|---|---|
| 8,194,438 | B2 | 6/2012 | Ahn et al. |
| 8,467,243 | B1 | 6/2013 | Shaken et al. |
| 8,542,514 | B1 | 9/2013 | Lakshminarayanan et al. |
| 8,567,596 | B1 | 10/2013 | Mason |
| 8,971,113 | B2 | 3/2015 | Lee |
| 8,976,588 | B2 | 3/2015 | Lee |
| 9,001,583 | B2 | 4/2015 | Lee et al. |
| 2003/0137496 | A1 | 7/2003 | Stevens et al. |
| 2005/0141267 | A1 | 6/2005 | Kwon |
| 2005/0162896 | A1 | 7/2005 | Jung |
| 2008/0152842 | A1 | 6/2008 | Searle |
| 2008/0266955 | A1 | 10/2008 | Plants |
| 2010/0245221 | A1 | 9/2010 | Khan |
| 2010/0247790 | A1 | 9/2010 | Gypen |
| 2011/0242059 | A1 | 10/2011 | Pasquero et al. |
| 2011/0261620 | A1 | 10/2011 | Shih et al. |
| 2012/0069679 | A1 | 3/2012 | Fujiki et al. |
| 2012/0213027 | A1 | 8/2012 | Allan et al. |
| 2013/0039127 | A1* | 2/2013 | Wang .............. G11C 14/0063 365/185.08 |
| 2013/0114325 | A1* | 5/2013 | Lin .............. G11C 14/009 365/148 |
| 2014/0030693 | A1 | 1/2014 | Dynlacht |
| 2014/0050025 | A1 | 2/2014 | Tsao et al. |
| 2014/0104946 | A1 | 4/2014 | Lee et al. |
| 2014/0112072 | A1 | 4/2014 | Tsao et al. |
| 2014/0369119 | A1* | 12/2014 | Tailliet .............. G11C 16/0408 365/185.08 |

OTHER PUBLICATIONS

International Search Report for International Application No. PCT/US15/56503 dated Jan. 8, 2016; 2 pages.

International Search Report for International Application No. PCT/US15/56503 dated Feb. 26, 2016; 2 pages.

Kushwaha, et al., "MTJ-Based Nonvolatile 9T SRAM Cell," Int. J. on Recent Trends in Engineering and Technology, vol. 8, No. 2, Jan 2013.

USPTO Non Final Rejection for U.S. Appl. No. 14/886,663 dated Jun. 8, 2016; 15 pages.

USPTO Non Final Rejection for U.S. Appl. No. 14/886,663 dated Oct. 17, 2016; 14 pages.

USPTO Notice of Allowance for U.S. Appl. No. 14/886,663 dated Jan. 6, 2017; 5 pages.

Written Opinion of the International Searching Authority for International Application No. PCT/US15/56503 dated Jan. 8, 2016; 6 pages.

Written Opinion of the International Searching Authority for International Application No. PCT/US15/65603 dated Feb. 26, 2016; 4 pages.

SIPO Office Action for Application No. 201580052647.1 dated Jul. 24, 2017; 10 pages.

* cited by examiner

2# 10-TRANSISTOR NON-VOLATILE STATIC RANDOM-ACCESS MEMORY USING A SINGLE NON-VOLATILE MEMORY ELEMENT AND METHOD OF OPERATION THEREOF

CROSS-REFERENCE TO RELATED APPLICATIONS

This application is a Continuation of U.S. patent application Ser. No. 14/886,663, filed Oct. 19, 2015, which claims the benefit of priority under 35 U.S.C. 119(e) to U.S. Provisional Patent Application Ser. No. 62/066,770, filed Oct. 21, 2014, all of which are incorporated by reference herein in their entirety.

TECHNICAL FIELD

This disclosure relates generally to semiconductor memories and more particularly to a Non-Volatile Static Random-Access Memory (nvSRAM) including nvSRAM cells having a reduced number of transistors and methods of operating the same.

BACKGROUND

Computer systems and portable electronic devices such as tablets and smart phones require large capacity, high speed volatile and non-volatile storage of data. Present types of semiconductor memory that use a combination of specialized volatile and non-volatile technologies. One type of volatile memory is static random-access memory (SRAM) which is often implemented using a bistable transistor flip-flop or latching circuit. The word "static" indicates that the memory retains its contents as long as power remains applied. "Random access" means that locations in the memory can be written to or read from in any order, regardless of the memory location that was accessed last. SRAMs offer advantages including reliability and fast reading and writing of the stored data, however the data retained in the SRAM cell is volatile. Interruption of the power supply source causes loss of the data in the SRAM cell.

A non-volatile SRAM (nvSRAM) includes an SRAM cell coupled with two or more non-volatile memory transistors to store data written to the SRAM cell in the event of an interruption of power. The non-volatile memory transistors may be implemented in different ways, for example using a Silicon Oxide Nitride Oxide Silicon (SONOS) transistor or a floating gate transistor in which a stored charge modifies the transistor's threshold voltage.

One disadvantage of present nvSRAM circuits is their limited density and relatively large memory cell size, typically including 12 or more transistors per nvSRAM cell.

Thus, there is a need for a non-volatile latch which overcomes the shortcomings of the conventional NVL cell architecture.

SUMMARY

A memory including an array of nvSRAM cells and method of operating the same are provided. Each nvSRAM cell includes a volatile charge storage circuit, and a non-volatile charge storage circuit. The volatile charge storage circuit can include a cross-coupled static random access memory (SRAM) latch. The non-volatile charge storage circuit generally includes or consists of exactly one non-volatile memory (NVM) element, a first transistor coupled to the NVM element through which data true is coupled to the volatile charge storage circuit, a second transistor coupled to the NVM element through which data complement is coupled to the volatile charge storage circuit and a third transistor through which the NVM element is coupled to a positive voltage supply line (VCCT).

In one embodiment, the first transistor is coupled to a first node of the NVM element, the second transistor is coupled to a second node of the NVM element and the third transistor is coupled the first node and VCCT. Other embodiments are also disclosed.

In another embodiment, the third transistor of the non-volatile charge storage circuit is coupled between VCCT and a first node of the NVM element, and the first and second transistors are couple to a second node of the NVM element.

The NVM element can include or consist of exactly one silicon-oxide-nitride-oxide-silicon (SONOS) transistor, or exactly one polysilicon floating gate transistor.

BRIEF DESCRIPTION OF THE DRAWINGS

Embodiments of the present invention will be understood more fully from the detailed description that follows and from the accompanying drawings and the appended claims provided below, where:

DETAILED DESCRIPTION

The present disclosure is directed generally to semiconductor memories and more particularly to a memory including a volatile charge storage circuit, and a non-volatile charge storage circuit including or consisting of exactly one non-volatile memory (NVM) element, and methods of operating the same to recall non-inverted data from the non-volatile charge storage circuit for every RECALL operation.

In the following description, for purposes of explanation, numerous specific details are set forth in order to provide a thorough understanding of the present invention. It will be evident, however, to one skilled in the art that the present invention may be practiced without these specific details. In other instances, well-known structures, and techniques are not shown in detail or are shown in block diagram form in order to avoid unnecessarily obscuring an understanding of this description.

Reference in the description to "one embodiment" or "an embodiment" means that a particular feature, structure, or characteristic described in connection with the embodiment is included in at least one embodiment of the invention. The appearances of the phrase "in one embodiment" in various places in the specification do not necessarily all refer to the same embodiment. The term to couple as used herein may include both to directly electrically connect two or more components or elements and to indirectly connect through one or more intervening components.

The terms "over," "under," "between," and "on" as used herein refer to a relative position of one layer with respect to other layers. As such, for example, one layer deposited or disposed over or under another layer may be directly in contact with the other layer or may have one or more intervening layers. Moreover, one layer deposited or disposed between layers may be directly in contact with the layers or may have one or more intervening layers. In contrast, a first layer "on" a second layer is in contact with that second layer. Additionally, the relative position of one layer with respect to other layers is provided assuming operations deposit, modify and remove films relative to a starting substrate without consideration of the absolute orientation of the substrate.

A first embodiment of a Non-Volatile Static Random-Access Memory (nvSRAM) cell 100 including a volatile charge storage circuit 102, and a non-volatile charge storage circuit 104 including or consisting of exactly one non-volatile memory (NVM) element 106 will now be described with reference to FIG. 1.

Figure 1:
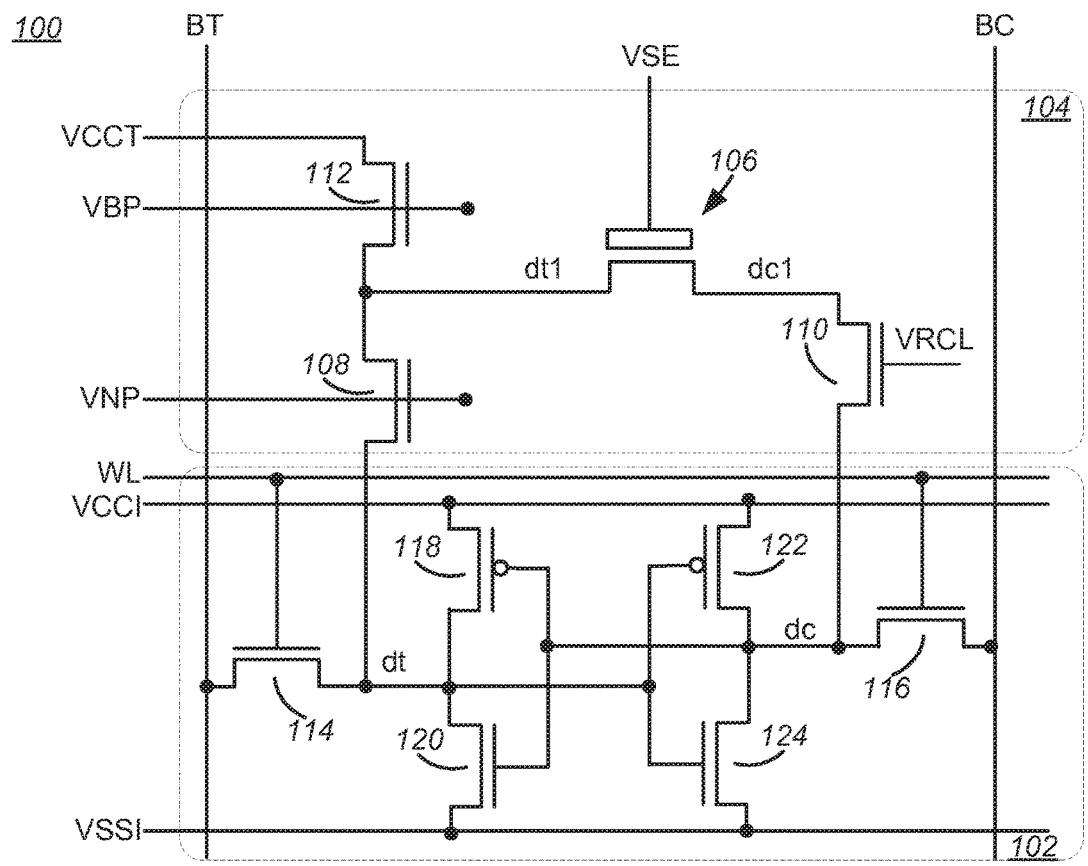
FIG. 1 is a schematic diagram of a Non-Volatile Static Random-Access Memory (nvSRAM) cell according to an embodiment of the present disclosure.

FIG. 1 illustrates a single nvSRAM cell 100, but it should be appreciated that an nvSRAM memory typically includes an array of a plurality of nvSRAM cells that are integrated with other peripheral circuits described in greater detail below, onto a semiconductor chip to form the nvSRAM memory. Additionally, an nvSRAM cell 100 typically includes a number of transistors, capacitors, and resistors, not all of which are shown as being unnecessary for an explanation or understanding of the nvSRAM cell of the present disclosure and its operation.

By NVM element 106 it is meant exactly one Silicon-Oxide-Nitride-Oxide-Silicon (SONOS) transistor, exactly one floating-gate MOS field-effect transistor (FGMOS), or exactly one ferroelectric random access memory (FeRAM) device. The NVM element 106 can be programmed or erased by a control signal VSE coupled to a gate node of the NVM element.

Generally, a SONOS transistor includes a gate stack formed over a substrate. The SONOS transistor further includes source/drain regions formed in a well in the substrate on either side of gate stack, which define a channel region underneath gate stack. Gate stack includes an oxide tunnel dielectric layer, one or more nitride or oxynitride charge-trapping layers, a top, blocking oxide layer and a poly-silicon (poly) or metal layer which serves as a control gate. When a negative bias is applied to the gate relative to the substrate or well, charge accumulated in the channel region is injected or tunnels through tunnel dielectric layer and are trapped in the charge-trapping layers, changing the threshold voltage ($V_T$) negative to turn on the SONOS transistor.

Generally, a FGMOS transistor is similar in structure to the SONOS transistor described above, differing primarily in that a FGMOS transistor includes a poly-silicon (poly) floating gate, which is capacitively coupled to a control gate of the transistor, rather than a nitride or oxynitride charge-trapping layers. Similar to the SONOS transistor described above the FGMOS transistor can be erased by applying an appropriate negative bias between the control gate and a well terminal to inject a charge (holes) on to the floating gate, lowering the threshold voltage $V_T$ necessary to turn on the FGMOS transistor.

FeRAM is a non-volatile random-access memory technology, which uses a ferroelectric layer to achieve non-volatility. FeRAM is operated similar to flash memory. Writing data is accomplished by applying a field across the ferroelectric layer by charging the plates on either side of it, forcing the atoms inside into the "up" or "down" orientation thereby storing a "1" or "0".

Referring to FIG. 1 the non-volatile charge storage circuit 104 generally includes, in addition to the NVM element 106 a first transistor or normal program transistor 108 through which a data true node (dt) in the volatile charge storage circuit 102 is coupled to a first node or terminal of the NVM element 106, shown here as a data true node (dt1) in the non-volatile charge storage circuit 104. The normal program transistor 108 can be any suitable transistor, including a bipolar, field effect transistor (FET) or metal oxide semiconductor (MOSFET), and in the embodiment shown is a N-type FET controlled by a control signal (VNP) applied to a gate node or terminal of the normal program transistor to couple data true node (dt) in the volatile charge storage circuit 102 to the first node of the NVM element 106, data true node (dt1), to normal program the NVM element during a STORE operation.

The non-volatile charge storage circuit 102 further includes a second transistor or recall transistor 110 through which a data complement node (dc) in the volatile charge storage circuit 102 is coupled to a second node or terminal of the NVM element 106, shown here as a data complement node (dc1) in the non-volatile charge storage circuit 104. As with the normal program transistor 108, the recall transistor 110 can be any suitable transistor, and in the embodiment shown is a NFET controlled by a control signal (VRCL) applied to a gate node or terminal of the recall transistor to couple data complement node (dc) in the volatile charge storage circuit 102 to the second node of the NVM element 106, data complement node (dc1), to recall data from the NVM element to the volatile charge storage circuit during a RECALL operation.

The non-volatile charge storage circuit 104 further includes a third transistor or bulk program transistor 112 coupled between the first node of the NVM element 106, data true node (dt1) in the non-volatile charge storage circuit 104, and a positive voltage supply line (VCCT) in the non-volatile charge storage circuit. The bulk program transistor 112 can be any suitable transistor, and in the embodiment shown is a NFET controlled by a control signal (VBP) applied to a gate node or terminal of the bulk program transistor to couple the first node of the NVM element 106, data true node (dt1), to VCCT during a bulk program operation.

Referring to FIG. 1 the volatile charge storage circuit 102 generally includes a cross-coupled static random access memory (SRAM) latch that has two stable states and is capable, as long as power is being provided, of receiving a bit of data from an exterior environment, retaining the bit of data, and transmitting the bit of data back to the exterior environment. If power is removed from the volatile charge storage circuit 102, the data will be lost. The volatile charge storage circuit 102 prevents loss of the bit of data by storing the bit of data in the non-volatile charge storage circuit 104, and recalling the bit of data to the volatile charge storage circuit 102 when power is restored.

The volatile charge storage circuit 102 generally includes a bitline true transistor 114, a bitline complement transistor 116, a first cross coupled inverter formed by transistors 118, 120 and the second cross coupled inverter formed by transistors 122, 124. In a standby state, the circuit is idle, the wordline (WL) is not asserted and so transistors 114, 116 disconnect the volatile charge storage circuit 102 from the bitline true (BT) and bitline complement (BC).

Figure 2:
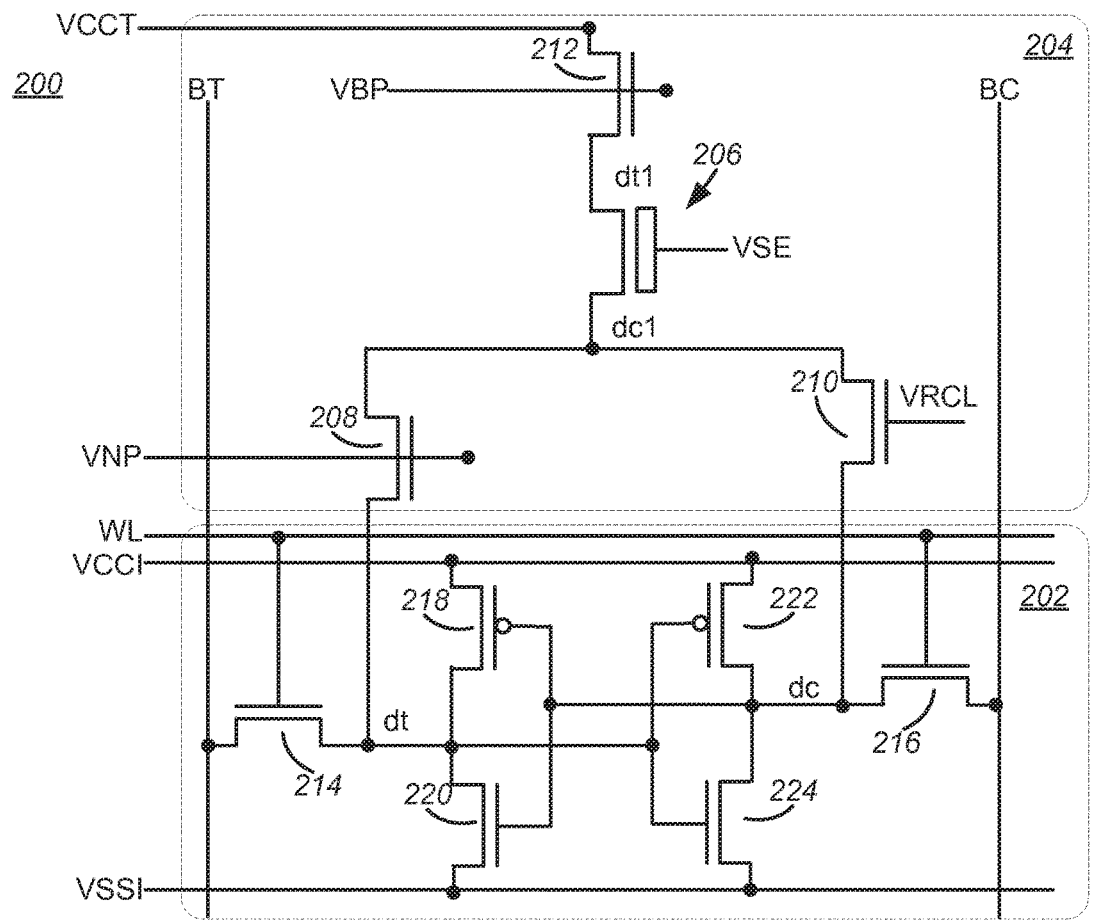
FIG. 2 is a schematic diagram of an nvSRAM cell according to another embodiment of the present disclosure.

FIG. 2 is a schematic diagram of an nvSRAM cell 200 according to another embodiment of the present disclosure. As with the nvSRAM cell 100 described above, the nvSRAM cell 200 includes a volatile charge storage circuit 202, and a non-volatile charge storage circuit 204 including or consisting of a NVM element 206.

As with the NVM element 106 described above, the NVM element 206 can be implemented using exactly SONOS transistor, exactly one FGMOS transistor, or exactly one FeRAM device. The NVM element 206 can be programmed or erased by a control signal VSE coupled to a gate node of the NVM element.

Referring to FIG. 1 the non-volatile charge storage circuit 204 generally includes, in addition to the NVM element 206, a first transistor or normal program transistor 208 through which a data true node (dt) in the volatile charge storage circuit 202 is coupled to a first node or terminal of the NVM element, shown here as a data complement node (dc1) in the non-volatile charge storage circuit 204. The normal program transistor 208 can be any suitable transistor, including a bipolar, FET or MOSFET, and in the embodiment shown is a N-type FET controlled by a control signal (VNP) applied to a gate node or terminal of the normal program transistor to couple data true node (dt) in the volatile charge storage circuit 202 to the first node of the NVM element 206, data complement node (dc1), to normal program the NVM element during a STORE operation.

The non-volatile charge storage circuit 204 further includes a second transistor or recall transistor 210 through which a data complement node (dc) in the volatile charge storage circuit 202 is coupled to the first node or terminal of the NVM element 206, shown here as a data complement node (dc1), in the non-volatile charge storage circuit 204. As with the normal program transistor 208, the recall transistor 210 can be any suitable transistor, and in the embodiment shown is a NFET controlled by a control signal (VRCL) applied to a gate node or terminal of the recall transistor to couple data complement node (dc) in the volatile charge storage circuit 202 to the first node of the NVM element 206, data complement node (dc1), to recall data from the NVM element to the volatile charge storage circuit 202 during a RECALL operation.

The non-volatile charge storage circuit 204 further includes a third transistor or bulk program transistor 212 coupled between a second node of the NVM element 206, data true node (dt1) in the non-volatile charge storage circuit 204, and a positive voltage supply line (VCCT) in the non-volatile charge storage circuit. The bulk program transistor 212 can be any suitable transistor, and in the embodiment shown is a NFET controlled by a control signal (VBP) applied to a gate node or terminal of the bulk program transistor to couple the second node of the NVM element 206, data true node (dt1), to VCCT during a bulk program operation.

Referring to FIG. 2 the volatile charge storage circuit 202 generally includes a cross-coupled SRAM latch that has two stable states and is capable, as long as power is being provided, of receiving a bit of data from an exterior environment, retaining the bit of data, and transmitting the bit of data back to the exterior environment.

The volatile charge storage circuit 202 generally includes a bitline true transistor 214, a bitline complement transistor 216, a first cross coupled inverter formed by transistors 218, 220 and the second cross coupled inverter formed by transistors 222, 224. In a standby state, the circuit is idle, the wordline (WL) is not asserted and so transistors 214, 216 disconnect the volatile charge storage circuit 202 from the bitline true (BT) and bitline complement (BC).

Figure 3:
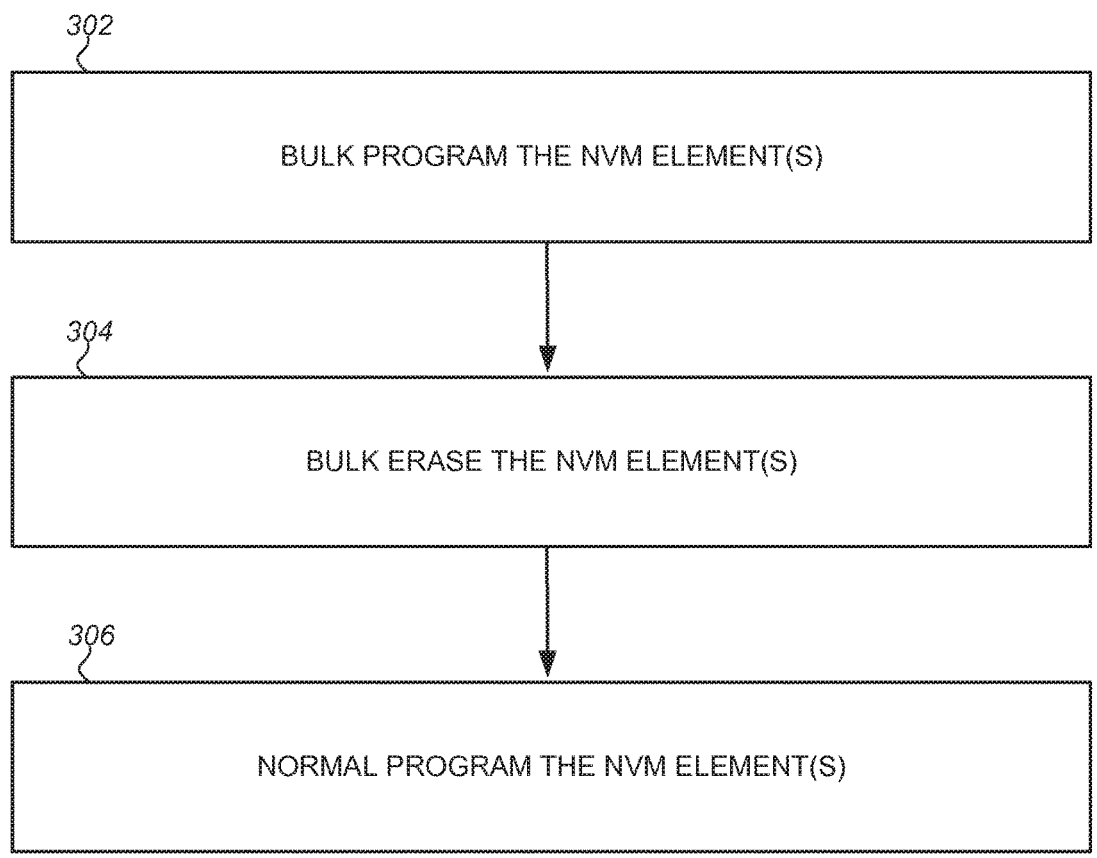
FIG. 3 is a flow chart illustrating an embodiment of a method for the STORE operation according to the present disclosure.
Figure 4:
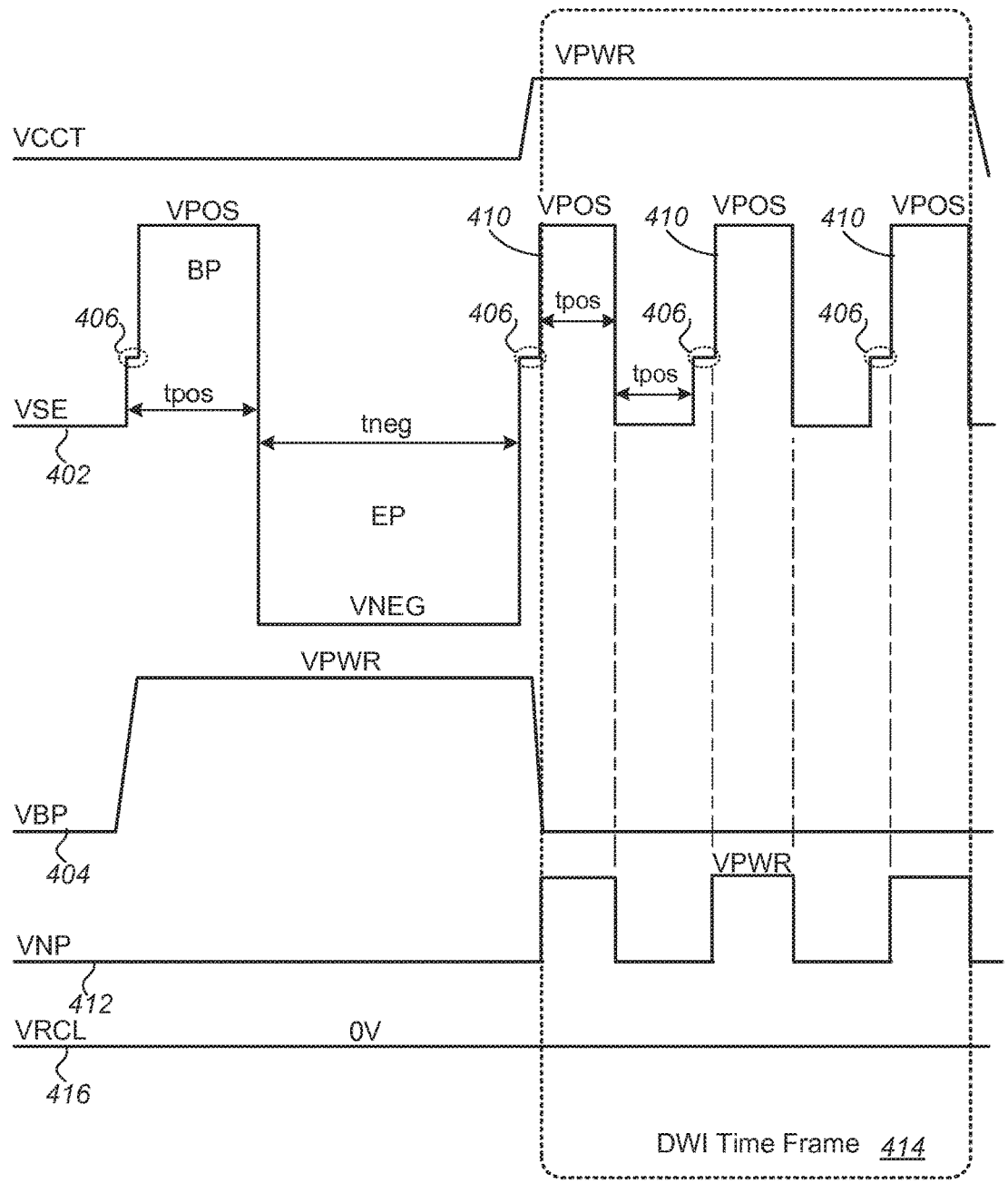
FIG. 4 is a timing diagram for describing a STORE operation associated with an nvSRAM cell according to an embodiment of the present disclosure.

A STORE operation for transferring or storing data from the volatile charge storage circuit of an nvSRAM cell according to the embodiment of FIG. 1 or FIG. 2 to the non-volatile charge storage circuit will now be described with reference to FIGS. 3 and 4. FIG. 3 is a flow chart illustrating an embodiment of a method for the STORE operation according to the present disclosure. FIG. 4 is a timing diagram for a STORE operation associated with an nvSRAM cell according to the embodiment of FIG. 1 or FIG. 2.

Referring to FIGS. 3 and 4 the STORE operation has three phases beginning with a bulk program (BP) of every nvSRAM cell 100/200 in the array (302). This can be accomplished by setting control signal VSE 402 coupled to the gate node of the NVM element 106/206 to a positive high voltage and turning ON bulk program transistor 112/212 with a control signal VBP 404 while for a first predetermined period. VCCT node is held at ground during this time. The positive high voltage VPOS applied to the gate node of the NVM element 106/206 is about 9.75 V, which is applied for a duration (tpos) of about 1 millisecond (ms) to bulk program (BP) the NVM element. Bulk program transistor 112/212 is turned ON by setting control signal VBP 404 to VPWR. As shown in FIG. 4 there is a brief delay 406 of 5 microsecond (µs) while the control signal VSE 402 coupled to the gate node of the NVM element precharges to VHSPS before rising to the full positive high voltage of about 9.75 V in the embodiment shown.

Next, every nvSRAM cell 100/200 in the array is bulk erased to set the NVM element 106/206 to an erased state (304). This can be accomplished by setting the control signal VSE 402 coupled to the gate node of the NVM element 106/206 to a negative high voltage for a second predetermined period while maintaining Bulk program transistor 112/212 by continuing to apply a control signal VBP 404 of VPWR. The negative high voltage of VNEG is applied to the gate node of the NVM element 106/206 in the embodiment shown is about −10.5 V, which is applied for a duration (tneg) of about 3 ms to bulk erase (EP) the NVM element.

Finally, nvSRAM cell(s) 100/200 in the array are programmed in a normal program phase during which VSE is set to a plurality of positive high voltages to STORE data from the data true node (dt) in the volatile charge storage circuit 102/202 to the non-volatile charge storage circuit 104/204 (306).

Referring to FIG. 4, the normal program phase begins with setting the positive voltage supply line (VCCT 408) to a positive voltage while turning OFF Bulk program transistor 112/212 by removing VPWR from control signal VBP 404, and setting the control signal VSE 402 to a plurality of program pulses 410. The NVM element(s) 106/206 is then programmed by setting control signal VNP 412 coupled to the gate node of the normal program transistor 108/208 to a plurality of positive voltages. The positive voltage applied to the gate node of the normal program transistor 108/208 is substantially equal to the positive voltage applied to the positive voltage supply line (VCCT 408). The plurality of program pulses 410 applied to the gate node of the NVM element 106/206 can have a peak voltage of about 9.75 V, the same as for VSE 402 in the bulk program (BP) phase. The plurality of program pulses can include at least 2 individual program pulses, each having a pulse width and time period between pulses of about 0.1 ms or greater. It is noted that the pulse width and duration of time between the program pulses need not be the same. In the embodiment shown the plurality of program pulses includes three substantially equal program pulses 410, each having a substantially equal pulse width and duration of time between the program pulses of about 0.2 ms for a 50% duty cycle Again, as shown in FIG. 4 for each 410 there is a brief delay 406 while the control signal VSE 402 coupled to the gate node of the NVM element precharges to VHSPS before rising to the full positive high voltage of about 9.75 V. Generally, the duration of this brief delay 406 is the same as for the bulk program (BP) phase.

When data stored in the data true node (dt) of the volatile charge storage circuit 102/202 is a logical '0', normal programming is achieved through the normal program transistor 108/208 being off and the NVM element 106/206 remains erased.

When data stored in the data true node (dt) of the volatile charge storage circuit 102/202 is a logical '1', the normal program transistor 108/208 OFF, and the NVM element 106/206 remains erased or program inhibited with a small disturb.

Applying a plurality of program pulses 410 to the gate node of the NVM element(s) 106/206, rather than a single, continuous positive high voltage as in conventional memories, mitigates the impact of a Dynamic Write Inhibit (DWI) during a DWI time frame 414, when data stored in the data true node (dt) of the volatile charge storage circuit 102/202 is a logical '1'.

Dynamic Write Inhibit (DWI) is a method of inhibiting the NVM element 100/200 from getting programmed. When the data true node (dt) is at a logic "1" or VPWR, and VNP node is also at a logic "1" or VPWR during the final program pulse or DWI time frame, the VNP transistor 108/208 is OFF as there is no VGS across it. Because of this dt1 and dc1 nodes couple up with VSE and inhibit the NVM element 100/200 from getting programmed. The coupled nodes (dt1 and dc1) now see a higher GIDL because VBP and VRCL are both at VGND. The GIDL effect will discharge the DWI nodes (dt1 and dc1) faster if only a single pulse is applied on VSE and ultimately program the NVM element 100/200. To mitigate this issue, a plurality of program pulses 410 of short duration of 0.2 ms are applied on VSE during the final program pulse so that the discharge on the DWI nodes (dt1 and dc1) is less and this helps to keep the NVM element 100/200 from getting programmed.

The control signal VRCL 416 coupled to the gate node of the recall transistor remains at 0V throughout the STORE operation to isolate the non-volatile charge storage circuit 104/204 of the nvSRAM cell 100/200 from the data complement node (dc) in the volatile charge storage circuit 102/202.

A RECALL operation for transferring or recalling data from the non-volatile charge storage circuit of an nvSRAM cell according to the embodiment of FIG. 1 or FIG. 2 to the volatile charge storage circuit will now be described with reference to FIGS. 5 through 7.

Figure 5:
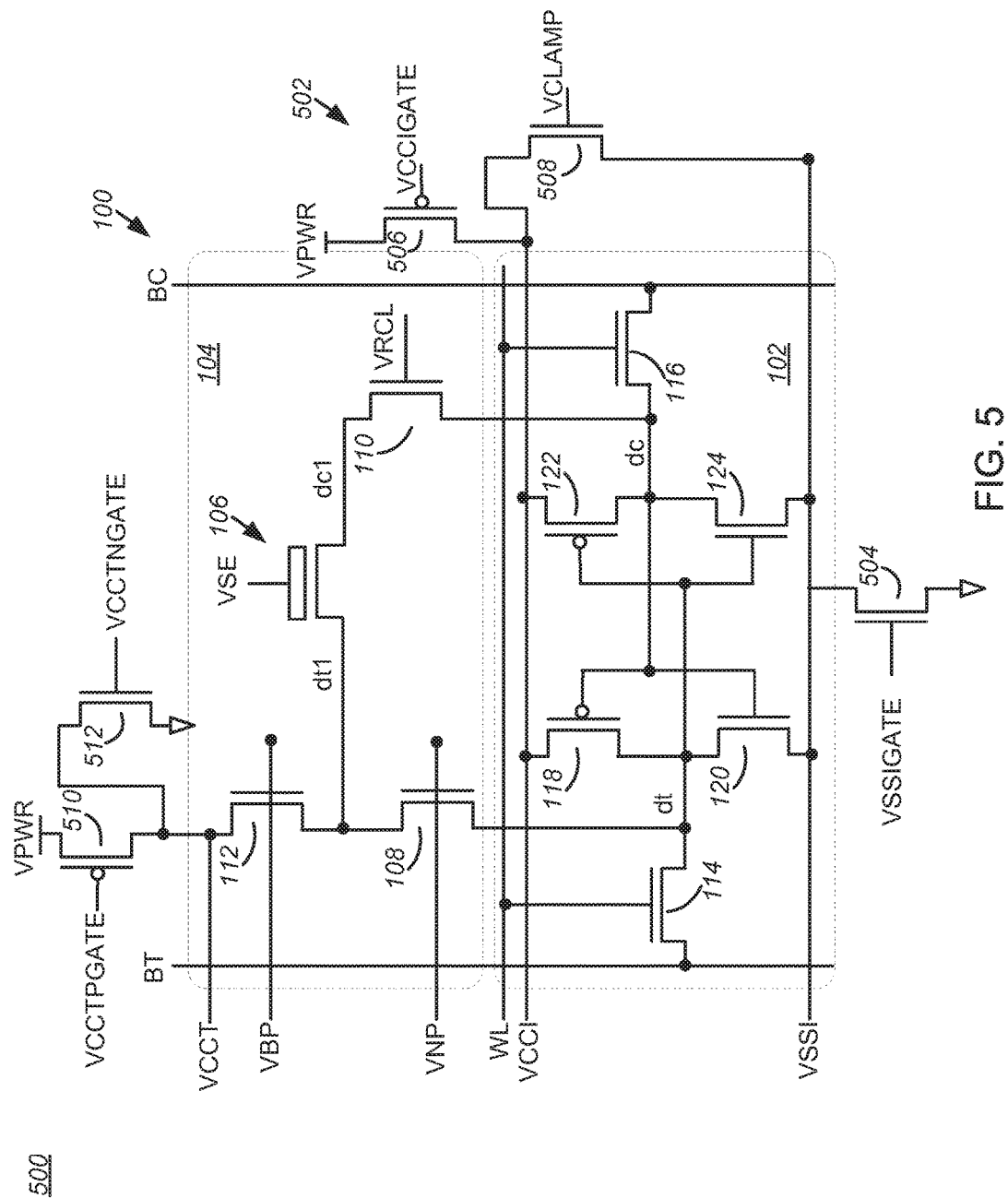
FIG. 5 is a portion of a Non-Volatile Static Random-Access Memory including a clamping circuit and an nvSRAM cell according to an embodiment of the present disclosure.

FIG. 5 is a portion of a Non-Volatile Static Random-Access Memory (nvSRAM 500) including the nvSRAM cell 100 of FIG. 1, a clamping circuit 502, and a negative supply voltage (VSS) transistor 504. Referring to FIG. 5, the clamping circuit 502, includes a first P-type transistor 506 through which the positive voltage supply line (VCCI) in the volatile charge storage circuit 102 is coupled to a supply voltage (VPWR), and an N-type transistor 508 through which VCCI is coupled to VSSI. The VSS transistor 504 is coupled between negative voltage supply line (VSSI) in the volatile charge storage circuit 102 and ground to float the VSSI during a RECALL operation, limiting the current through the volatile charge storage circuit 102/202. The nvSRAM 500 further includes a first VCC transistor 510 through which the positive voltage supply line (VCCT) in the non-volatile charge storage circuit 104 can be coupled to VPWR, and a second VCC transistor 512 through which VCCT can be coupled to ground.

Figure 6:
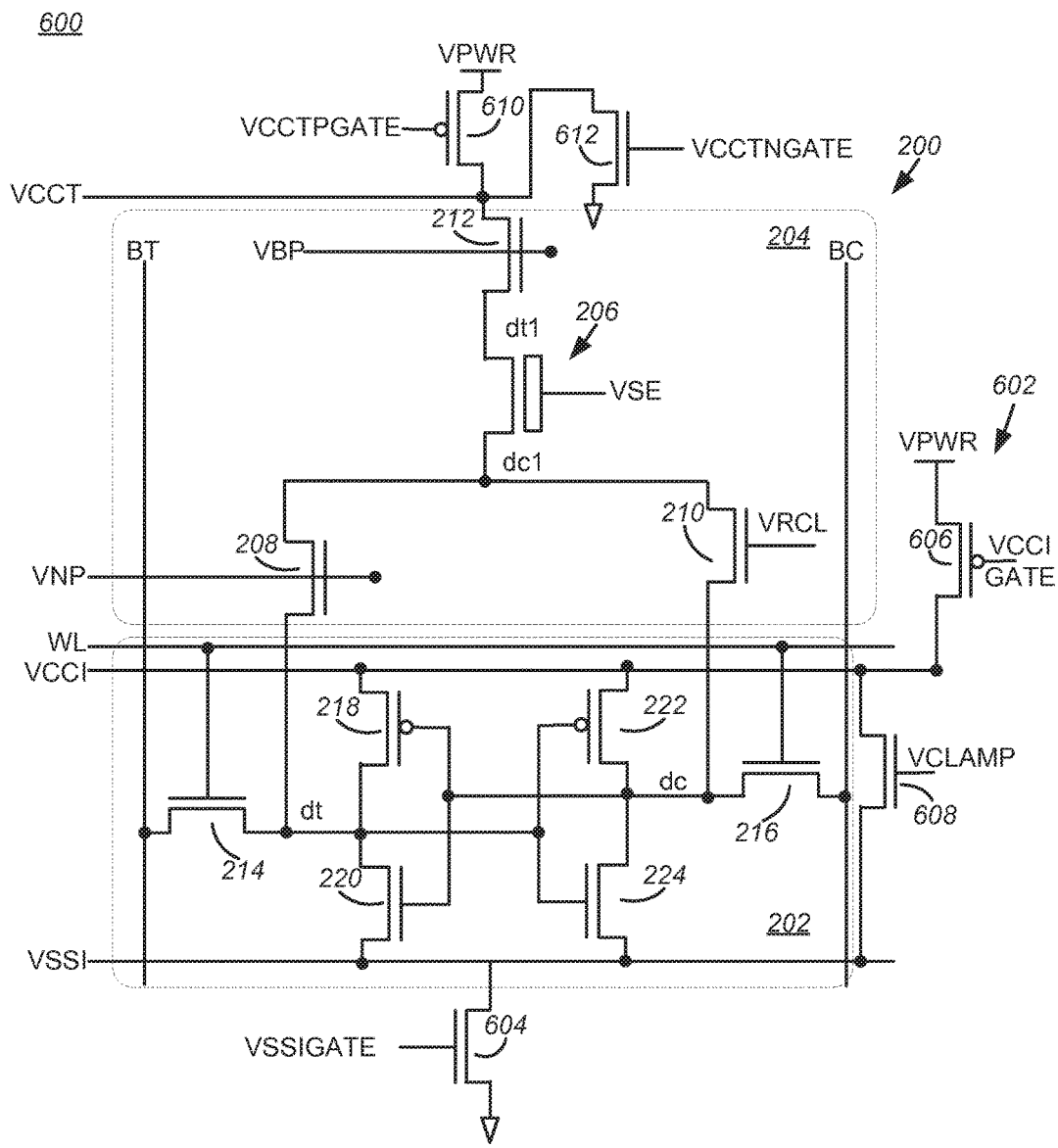
FIG. 6 is a portion of a Non-Volatile Static Random-Access Memory including a clamping circuit and an nvSRAM cell according to another embodiment of the present disclosure.

FIG. 6 is a portion of an nvSRAM 600 according to another embodiment of the present disclosure including the nvSRAM cell 200 of FIG. 2, a clamping circuit 602, and a negative supply voltage (VSS) transistor 604. Referring to FIG. 6, the clamping circuit 602, includes a first P-type transistor 606 through which VCCI in the volatile charge storage circuit 202 is coupled to VPWR, and an N-type transistor 608 through which VCCI is coupled to VSSI. The VSS transistor 604 is coupled between negative voltage supply line (VSSI) in the volatile charge storage circuit 202 and ground to float the VSSI during a RECALL operation, limiting the current through the volatile charge storage circuit 102/202. The nvSRAM 600 further includes a first VCC transistor 610 through which the positive voltage supply line (VCCT) in the non-volatile charge storage circuit 204 can be coupled to VPWR, and a second VCC transistor 612 through which VCCT can be coupled to ground.

Figure 7:
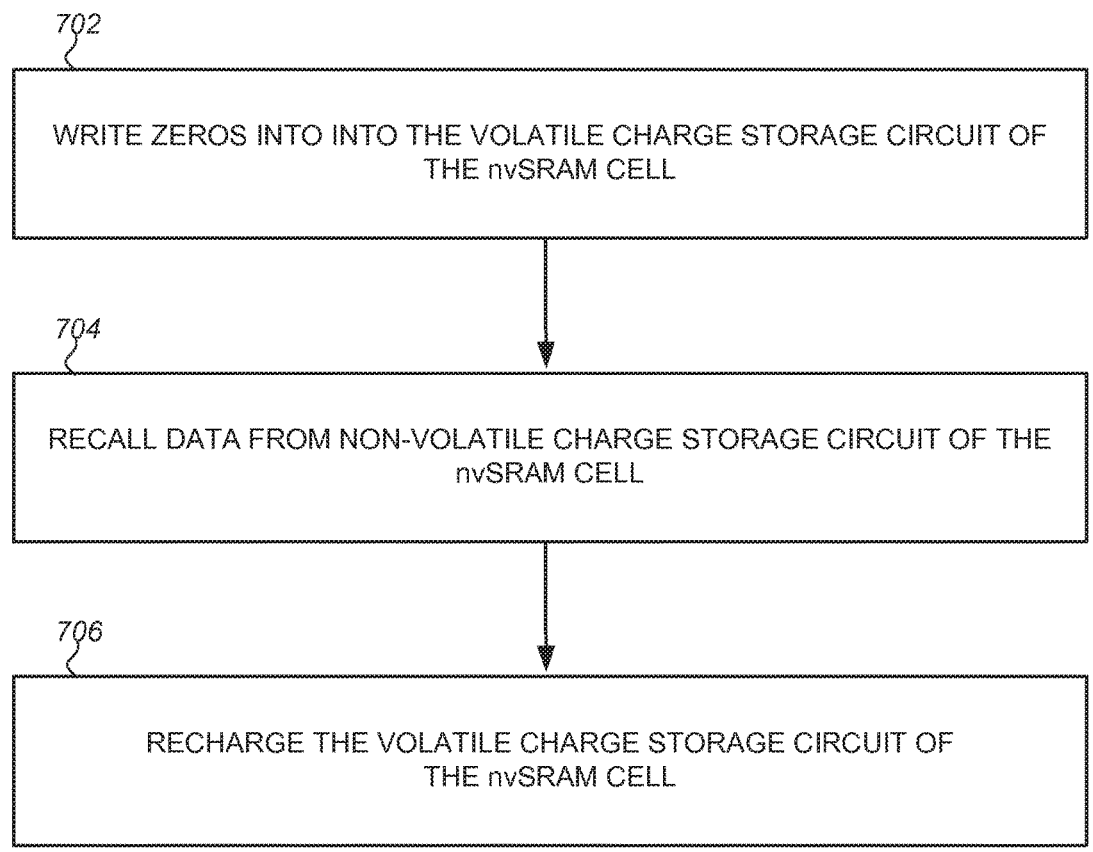
FIG. 7 is a flow chart illustrating an embodiment of a method for a RECALL operation according to the present disclosure.

FIG. 7 is a flow chart illustrating an embodiment of a method for the RECALL operation according to the present disclosure. Referring to FIGS. 5 through 7 the RECALL operation has three phases beginning with writing zeros into the volatile charge storage circuit 102/202 of one or more nvSRAM cells 100/200 in an array (702). Assuming at power up the data stored in the data true node (dt) of the volatile charge storage circuit 102/202 is a logical '1' and the data complement node (dc) is a logical '0', this can be accomplished by setting a control signal VSSIGATE coupled to a gate node of the VSS transistor 504/604 to an NMOS threshold above ground and limiting the current through the volatile charge storage circuit 102/202. The clamping circuit 502/702 between VCCI and VSSI is turned on which puts the VSSI node at VCCI-NMOS threshold of VCLAMP transistor, VCCT is coupled to ground, and the normal program transistor 108/208 and the Bulk program transistor 112/212 turned ON so that the data stored in the volatile charge storage circuit 102/202 flips. That is the voltage at data complement node (dc) of the volatile charge storage circuit 102/202 goes to VCCI or a logical '1', while the data true node (dt) goes to VSSI.

Next, data is recalled from the non-volatile charge storage circuit 104/204 of the nvSRAM cell in a RECALL phase (704). This can be accomplished by setting control signal VSE to a voltage between an erased threshold voltage (Vte) and a programmed threshold voltage (Vtp) of the NVM element 106/206, such as about 0V. The recall transistor 110/210 and Bulk program transistor 112/212 of the non-volatile charge storage circuit 104/204 are turned ON and the normal program transistor 108/208 is turned OFF. VCCT is coupled to or maintained at ground potential. When the NVM element 106/206 is erased the data complement node (dc) in the volatile charge storage circuit 102/202 goes to ground (VGND) or a logical '0', while the data true node (dt) goes to VCCI or a logical '1'.

Finally, the volatile charge storage circuit 102/202 of the nvSRAM cell 100/200 is recharged in a recharge phase (706). Referring to FIGS. 5 and 6, this can be accomplished by turning OFF the clamping circuit 502/702 to unclamp VCCI and VSSI, and resetting control signal VSSIGATE coupled to the gate node of the VSS transistor 504/604 to turn ON the VSS transistor applying VSSI to the nvSRAM cell 100/200 The volatile charge storage circuit 102/202 latches the non-inverted data from the data complement node (dc1) in the non-volatile charge storage circuit 104/204 and the RECALL operation is complete.

Figure 8:
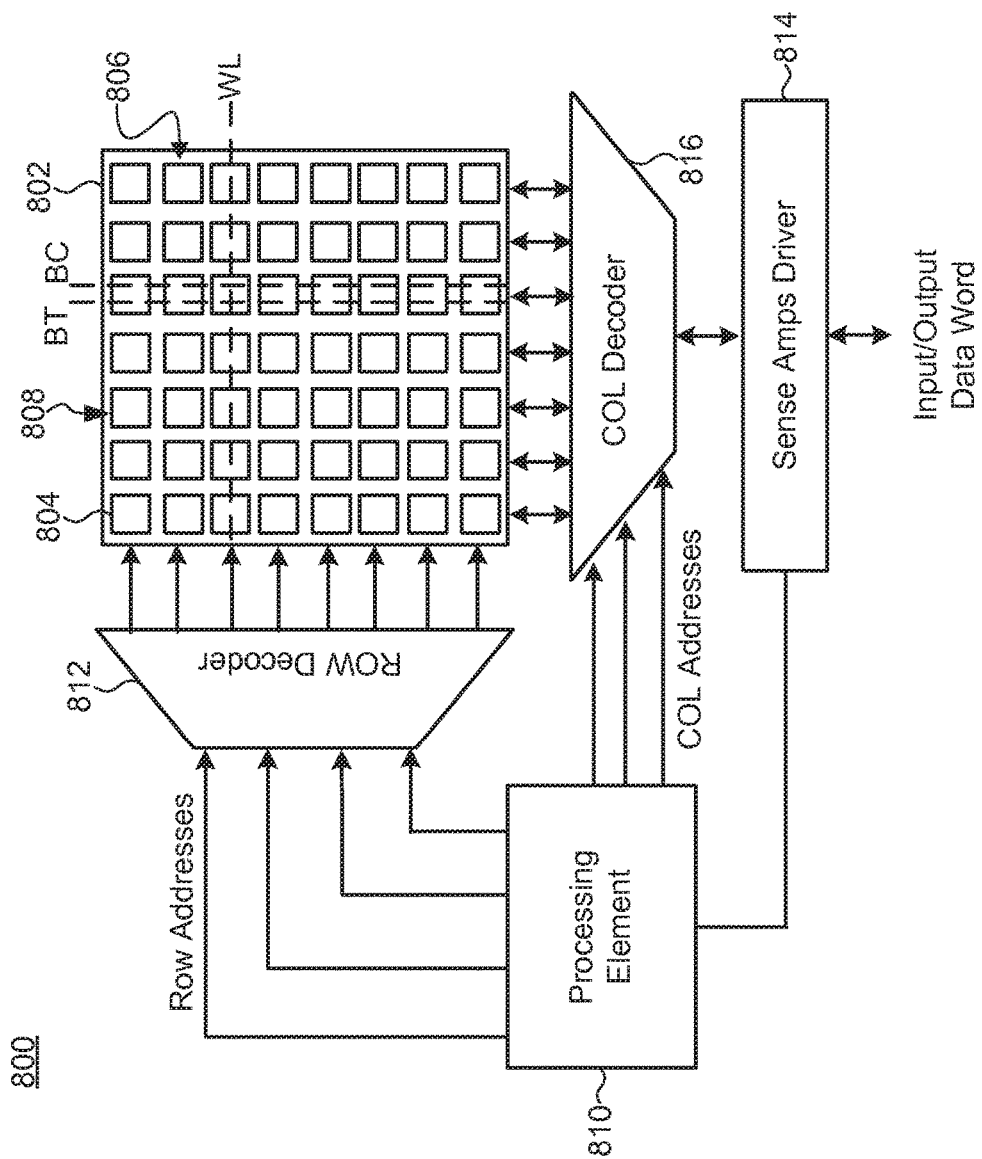
FIG. 8 is a block diagram of a semiconductor memory including a processing element and an array of nvSRAM cells according to an embodiment of the present disclosure.

FIG. 8 is a block diagram of a semiconductor memory 800 including an array 802 of nvSRAM cells 804 arranged in a number of rows 806 each sharing a common wordline (WL) and a number of columns 808 each sharing a common bitline or bitline true (BT) and a bitline complement (BC). Referring to FIG. 8, the semiconductor memory 800 further includes a processing element 810, such as a micro-controller, micro-processor or state machine, to issue commands or control signals to each of the nvSRAM cells 804 to execute STORE and RECALL operations as described above, and other peripheral circuits for reading from or writing to the memory array. The peripheral circuits include a row decoder 812 to convert and apply a memory address to the wordlines of nvSRAM cells 804 of the array 802. When a data word is read from the semiconductor memory 800, nvSRAM cells 804 coupled to a selected wordline (WL) are read out to bitline true (BT) and bitline complement (BC), and a state of those lines is detected by a sense amplifier/driver 814. The column decoder 816 outputs the data from the bitline true and bitline complement onto the sense amplifier/driver 814. When a data word is stored in the semiconductor memory 800, the column decoder 816 receives an input data word and applies it to the sense amplifier/driver 814 which drives the bitline true (BT) and bitline complement (BC) to read out the data in the nvSRAM cells 804 coupled to a selected wordline.

Thus, embodiments of semiconductor memories including and a non-volatile charge storage circuit including or consisting of exactly one NVM element and methods of operating the same have been described. Although the present disclosure has been described with reference to specific exemplary embodiments, it will be evident that various modifications and changes may be made to these embodiments without departing from the broader spirit and scope of the disclosure. Accordingly, the specification and drawings are to be regarded as an illustrative rather than a restrictive sense.

The Abstract of the Disclosure is provided to comply with 37 C.F.R. § 1.72(b), requiring an abstract that will allow the reader to quickly ascertain the nature of one or more embodiments of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

Reference in the description to one embodiment or an embodiment means that a particular feature, structure, or characteristic described in connection with the embodiment is included in at least one embodiment of the circuit or method. The appearances of the phrase one embodiment in various places in the specification do not necessarily all refer to the same embodiment.

What is claimed is:

1. A memory comprising:
an array of non-volatile Static Random Access Memory (nvSRAM) cells, each nvSRAM cell comprising:
a volatile charge storage circuit; and
a non-volatile charge storage circuit comprising a non-volatile memory (NVM) element, a first transistor coupled to the NVM element through which data is coupled to the volatile charge storage circuit, a second transistor coupled to the NVM element through which a complement of the data is coupled to the volatile charge storage circuit and a third transistor through which the NVM element is coupled to a first positive voltage supply line (VCCT);
a fourth transistor coupled between a negative voltage supply line (VSSI) in the volatile charge storage circuit and a negative voltage supply (VSS); and
a processing element configured to issue control signals to each of the nvSRAM cells to execute a STORE operation and a RECALL operation, the control signals including a signal to the fourth transistor to electrically disconnect the VSSI from the VSS during the RECALL operation.

2. The memory of claim 1, wherein the non-volatile charge storage circuit in each nvSRAM comprises exactly one NVM element.

3. The memory of claim 2, wherein the control signals comprise signals for normal programming in which the first transistor is ON and the second and third transistors are OFF, and a plurality of pulses are applied to a gate node of the NVM element.

4. The memory of claim 3, wherein the processing element is further configured to issue control signals for the STORE operation comprising signals for bulk programming to set the NVM element to a programmed state, and signals for bulk erasing to set the NVM element to an erased state, prior to issuing signals for normal programming.

5. The memory of claim 1, wherein the processing element is further configured to issue control signals for the RECALL operation so that data recalled out of the non-volatile charge storage circuit into the volatile charge storage circuit is non-inverted.

6. The memory of claim 1, further comprising a clamping circuit, and wherein the processing element is further configured to issue control signals including a signal to the clamping circuit to electrically couple a second positive voltage supply line (VCCI) in the volatile charge storage circuit to the VSSI during the RECALL operation.

7. The memory of claim 6, further comprising a fifth transistor coupled between VCCT in the non-volatile charge storage circuit and ground (VGND), and wherein the processing element is further configured to issue control signals including a signal to the fifth transistor to electrically couple VCCT to VGND during the RECALL operation.

8. A memory comprising:
an array of non-volatile Static Random Access Memory (nvSRAM) cells, each nvSRAM cell comprising:
a volatile charge storage circuit; and
a non-volatile charge storage circuit comprising exactly one non-volatile memory (NVM) element, a first transistor through which a data true node (dt) in the volatile charge storage circuit is coupled to a first node of the NVM element, a second transistor through which a data complement node (dc) in the volatile charge storage circuit is coupled to the first node of the NVM element, and a third transistor through which a second node of the NVM element is coupled to a first positive voltage supply line (VCCT);

a fourth transistor coupled between a negative voltage supply line (VSSI) in the volatile charge storage circuit and a negative voltage supply (VSS); and a processing element configured to issue control signals to each of the nvSRAM cells to execute a STORE operation and a RECALL operation, wherein the control signals the processing element is configured to issue during the RECALL operation include a signal to the fourth transistor to electrically disconnect the VSSI from the VSS.

9. The memory of claim 8, wherein the control signals comprise signals for normal programming in which the first transistor is ON and the second and third transistors are OFF, and a plurality of pulses are applied to a gate node of the NVM element.

10. The memory of claim 8, wherein the processing element is further configured to issue control signals for the STORE operation comprising signals for bulk programming to set the NVM element to a programmed state, and signals for bulk erasing to set the NVM element to an erased state, prior to issuing signals for normal programming.

11. The memory of claim 8, wherein the processing element is configured to issue control signals for the RECALL operation so that data recalled out of the non-volatile charge storage circuit into the volatile charge storage circuit is non-inverted.

12. The memory of claim 8, further comprising a clamping circuit, and wherein the processing element is further configured to issue control signals including a signal to the clamping circuit to electrically couple a second positive voltage supply line (VCCI) in the volatile charge storage circuit to the VSSI during the RECALL operation.

13. The memory of claim 12, further comprising a fifth transistor coupled between VCCT in the non-volatile charge storage circuit and ground (VGND), and wherein the processing element is further configured to issue control signals including a signal to the fifth transistor to electrically couple VCCT to VGND during the RECALL operation.

14. A memory comprising:
an array of non-volatile Static Random Access Memory (nvSRAM) cells, each nvSRAM cell comprising:
a volatile charge storage circuit; and
a non-volatile charge storage circuit comprising a non-volatile memory (NVM) element, a first transistor coupled to the NVM element through which data is coupled to the volatile charge storage circuit, a second transistor coupled to the NVM element through which a complement of the data is coupled to the volatile charge storage circuit and a third transistor through which the NVM element is coupled to a first positive voltage supply line (VCCT); and a processing element configured to issue control signals to each of the nvSRAM cells execute a STORE operation, wherein during a normal program phase of the STORE operation in which the first transistor is ON and the second and third transistors are OFF, the processing element is configured to issue control signals including a plurality program pulses applied to a gate node of the NVM element, each program pulse having a pulse width substantially equal to a time between program pulses.

15. The memory of claim 14, wherein the processing element is further configured to issue control signals for the STORE operation comprising signals for bulk programming to set the NVM element to a programmed state, and signals for bulk erasing to set the NVM element to an erased state, prior to issuing signals for normal programming.

16. The memory of claim 14, wherein the processing element is further configured to issue control signals for a RECALL operation so that data recalled out of the non-volatile charge storage circuit into the volatile charge storage circuit is non-inverted.

17. The memory of claim 14, wherein further comprising a fourth transistor coupled between a negative voltage supply line (VSSI) in the volatile charge storage circuit and a negative voltage supply (VSS), and wherein the processing element is further configured to issue control signals for a RECALL operation including a signal to the fourth transistor to electrically disconnect the VSSI from the VSS during the RECALL operation.

18. The memory of claim 17, further comprising a clamping circuit, and wherein the processing element is further configured to issue control signals including a signal to the clamping circuit to electrically couple a second positive voltage supply line (VCCI) in the volatile charge storage circuit to the VSSI during the RECALL operation.

19. The memory of claim 18, further comprising a fifth transistor coupled between VCCT in the non-volatile charge storage circuit and ground (VGND), and wherein the processing element is further configured to issue control signals including a signal to the fifth transistor to electrically couple VCCT to VGND during the RECALL operation.

* * * * *